United States Patent
Haustein et al.

(10) Patent No.: US 8,055,971 B2
(45) Date of Patent: Nov. 8, 2011

(54) APPARATUS AND METHOD TO ENCODE BINARY DATA INTO TRINARY DATA

(75) Inventors: Nils Haustein, Soergenloch (DE); Craig Anthony Klein, Tucson, AZ (US); Henry Zheng Liu, Tucson, AZ (US); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 1099 days.

(21) Appl. No.: 11/696,072

(22) Filed: Apr. 3, 2007

(65) Prior Publication Data

US 2008/0246638 A1 Oct. 9, 2008

(51) Int. Cl.
*H03M 13/00* (2006.01)
(52) U.S. Cl. .................... 714/752; 375/286; 341/57
(58) Field of Classification Search .............. 714/752; 375/286; 341/57
See application file for complete search history.

(56) References Cited

U.S. PATENT DOCUMENTS

| | | | | |
|---|---|---|---|---|
| 4,863,247 A | * | 9/1989 | Lasher et al. | 359/108 |
| 5,533,056 A | * | 7/1996 | Cripps | 375/286 |
| 6,631,241 B2 | | 10/2003 | Yamauchi et al. | |
| 6,872,511 B2 | | 3/2005 | Hirokane et al. | |
| 2005/0055170 A1 | | 3/2005 | Gibson et al. | |

FOREIGN PATENT DOCUMENTS

EP 145279 A * 6/1989

* cited by examiner

*Primary Examiner* — Guy Lamarre
(74) *Attorney, Agent, or Firm* — Dale F. Regelman; Quarles & Brady LLP

(57) ABSTRACT

An apparatus and method are disclosed to encode binary data into trinary data. Applicants' method provides binary data, and encodes that binary data into trinary data. By "binary data," Applicants mean a plurality of bits, wherein each of those bits comprises a value selected from the group consisting of a first value and a second value. By "trinary data," Applicants mean a plurality of bits, wherein each of those bits comprises a value selected from the group consisting of a first value, a second value, and a third value. The trinary data may be stored in ROM optical disks, nano-sized indentations in a thin-film, or multi-level magnetic storage. The trinary data may be also transmitted via three light levels in an optical communications network.

20 Claims, 13 Drawing Sheets

| 310 | 320 | 330 | 340 |
|---|---|---|---|
| INITIAL STATE | DESTINATION STATE | ORIGINAL BINARY DATA | ENCODED TRISTATE DATA |
| $S_0$ | $S_0$ | 00 | 00 |
| $S_0$ | $S_1$ | 10 | 12 |
| $S_0$ | $S_2$ | 01 | 10 |
| $S_0$ | $S_3$ | 11 | 20 |
| $S_1$ | $S_0$ | 00 | 21 |
| $S_1$ | $S_1$ | 10 | 02 |
| $S_1$ | $S_2$ | 01 | 11 |
| $S_1$ | $S_3$ | 11 | 01 |
| $S_2$ | $S_0$ | 00 | 11 |
| $S_2$ | $S_1$ | 10 | 01 |
| $S_2$ | $S_2$ | 01 | 21 |
| $S_2$ | $S_3$ | 11 | 02 |
| $S_3$ | $S_0$ | 00 | 10 |
| $S_3$ | $S_1$ | 10 | 20 |
| $S_3$ | $S_2$ | 01 | 00 |
| $S_3$ | $S_3$ | 11 | 12 |

| | | | |
|---|---|---|---|
| 310 | 320 | 330 | 340 |

| INITIAL STATE | DESTINATION STATE | ORIGINAL BINARY DATA | ENCODED TRISTATE DATA |
|---|---|---|---|
| $S_0$ | $S_0$ | 00 | 00 |
| $S_0$ | $S_1$ | 10 | 12 |
| $S_0$ | $S_2$ | 01 | 10 |
| $S_0$ | $S_3$ | 11 | 20 |
| $S_1$ | $S_0$ | 00 | 21 |
| $S_1$ | $S_1$ | 10 | 02 |
| $S_1$ | $S_2$ | 01 | 11 |
| $S_1$ | $S_3$ | 11 | 01 |
| $S_2$ | $S_0$ | 00 | 11 |
| $S_2$ | $S_1$ | 10 | 01 |
| $S_2$ | $S_2$ | 01 | 21 |
| $S_2$ | $S_3$ | 11 | 02 |
| $S_3$ | $S_0$ | 00 | 10 |
| $S_3$ | $S_1$ | 10 | 20 |
| $S_3$ | $S_2$ | 01 | 00 |
| $S_3$ | $S_3$ | 11 | 12 |

APPARATUS AND METHOD TO ENCODE BINARY DATA INTO TRINARY DATA

FIELD OF THE INVENTION

This invention relates to apparatus and method to encode binary data into trinary data for storage, and later decode the trinary data back into the original binary data. The trinary data may be stored in ROM optical disks, nano-sized indentations in a thin-film, or multi-level magnetic storage. The trinary data may also be transmitted via three light levels in an optical communications network.

BACKGROUND OF THE INVENTION

Traditionally a system for information storage comprises a storage controller and an archiving storage. The storage controller receives information from one or more client systems and stores the information in the archiving storage as binary data.

SUMMARY OF THE INVENTION

Applicants' invention comprises an apparatus and method to encode binary data into trinary data. Applicants' method provides binary data, and encodes that binary data into trinary data. By "binary data," Applicants mean a plurality of bits, wherein each of those bits comprises a value selected from the group consisting of a first value and a second value. By "trinary data," Applicants mean a plurality of bits, wherein each of those bits comprises a value selected from the group consisting of a first value, a second value, and a third value.

BRIEF DESCRIPTION OF THE DRAWINGS

The invention will be better understood from a reading of the following detailed description taken in conjunction with the drawings in which like reference designators are used to designate like elements, and in which.

DETAILED DESCRIPTION OF THE PREFERRED EMBODIMENTS

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the following description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
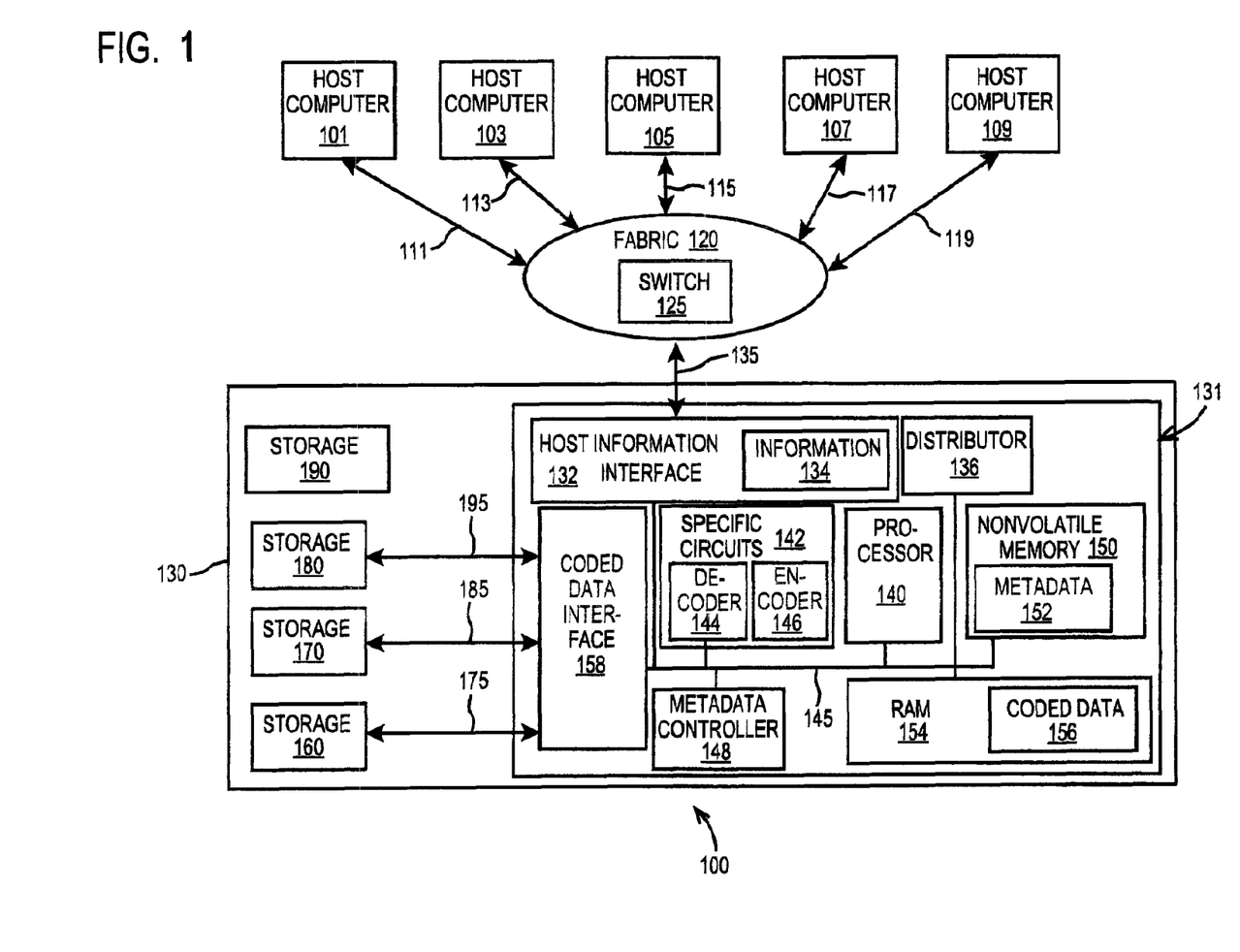
FIG. 1 is a block diagram illustrating one embodiment of Applicants' data storage system.

FIG. 1 illustrates Applicants' data storage system 100. In the illustrated embodiment of FIG. 1, system 100 comprises a switched-access-network, wherein one or more switches 125 are used to create a switching fabric 120. In certain embodiments data storage system 100 is implemented using the Small Computer Systems Interface (SCSI) protocol running over a Fibre Channel ("FC") physical layer. In other embodiments, data storage system 100 may be implemented utilizing other protocols, such as Infiniband, FICON (a specialized form of Fibre Channel CONnectivity), TCP/IP, Ethernet, Gigabit Ethernet, or iSCSI. The switches 125 have the addresses of both the hosts 101, 103, 105, 107, 109 and controller 131 so that any of hosts 101, 103, 105, 107, and/or 109, can be interchangeably connected to any controller 131.

Host computers 101, 103, 105, 107, and 109, each comprise a computing system, such as a mainframe, personal computer, workstation, and combinations thereof, including an operating system such as Windows, AIX, Unix, MVS, LINUX, etc. (Windows is a registered trademark of Microsoft Corporation; AIX is a registered trademark and MVS is a trademark of IBM Corporation; UNIX is a registered trademark in the United States and other countries licensed exclusively through The Open Group; and LINUX is a registered trademark of Linus Torvald). In certain embodiments, host computers 101, 103, 105, 107, and 109 further include a storage management program. The storage management program in the host computers 101, 103, 105, 107, and 109 may include the functionality of storage management type programs known in the art that manage the transfer of data to and from a data storage and retrieval system, such as the IBM DFSMS implemented in the IBM MVS operating system.

Host computers 101, 103, 105, 107, and 109, are coupled to fabric 120 utilizing I/O interfaces 111, 113, 115, 117, and 119, respectively. I/O interfaces 111, 113, 115, 117, and 119, may be any type of I/O interface; for example, a FC arbitrated loop, a point-to-point FC connection to fabric 120 or another form of one or more signal lines used by host computers 101, 103, 105, 107, and 109, to transfer information directly to and from fabric 120. Fabric 120 includes, for example, one or more FC switches 125 used to connect two or more computer networks. In certain embodiments, FC switch 125 is a conventional router switch. In an alternate embodiment, host computers 101, 103, 105, 107, and/or 109, are connected in a point-to-point configuration to storage controller 131 without a switch.

Switch 125 interconnects host computers 101, 103, 105, 107, and 109, to controller 131 across I/O interface 135. I/O interface 135 may be any type of I/O interface, for example, a Fibre Channel, Infiniband, Gigabit Ethernet, Ethernet, TCP/IP, iSCSI, SCSI I/O interface or one or more signal lines used by FC switch 125 to transfer information respectively to and from controller 131 and subsequently to a plurality of data storage media 160, 170, 180, and 190. Alternately, data storage media 160, 170, 180, and 190, could be physically remote from each other as well as controller 131, so that a single disaster could jeopardize only one of data storage media, 160, 170, 180, and 190. By "data storage medium," Applicants' mean a data storage medium in combination with hardware, software, and/or firmware, required to read trinary data from, and write trinary data to, that data storage medium.

Storage array 130 comprises controller 131 and storage 160, 170, 180, and 190. Controller 131 and storage 160, 170, 180, and 190 may be co-located in a common frame or box. Alternately, controller 131 and storage 160, 170, 180, and 190 may be spread apart geographically, for disaster recovery reasons, in what is sometimes called a geoplex. Storage 160, 170, 180, and/or 190 may also have separate and distinct controllers working in conjunction to provide access to said storage in the geoplex.

Controller 131 may take many different forms and may include an embedded system, a distributed control system, a personal computer, workstation, etc. In the illustrated embodiment of FIG. 1, storage controller 131 comprises processor 140, metadata controller 148, random access memory (RAM) 154, nonvolatile memory 150, specific circuits 142, coded data interface 158, and host information interface 132. Host information interface 132 holds information 134 which will either be encoded by encoder 146 during a write operation to storage 160, 170, 180, 190; or has been read and decoded by decoder 144 during a read operation from storage 160, 170, 180, 190. In certain embodiments, RAM 154 is used as a data cache. Processor 140, RAM 154, nonvolatile memory 150, specific circuits 142, metadata controller 148, coded data interface 158 and host information interface 132 communicate with each other across bus 145.

Alternatively, RAM 154 and/or nonvolatile memory 150 may reside in processor 140 along with specific circuits 142, coded data interface 158, metadata controller 148, and host information interface 132. Processor 140 may include an off-the-shelf microprocessor, custom processor, FPGA, ASIC, or other form of discrete logic. In certain embodiments, RAM 154 is used as a cache for data written by hosts 101, 103, 105, 107, and/or 109, or read for hosts 101, 103, 105, 107, and/or 109, to hold calculated data, stack data, executable instructions, etc. In certain embodiments, RAM 154 is used for the temporary storage of coded trinary data 156 received from encoder 146 before that trinary data is stored on data storage media, 160, 170, 180, and 190.

Nonvolatile memory 150 may comprise any type of nonvolatile memory such as Electrically Erasable Programmable Read Only Memory (EEPROM), flash Programmable Read Only Memory (PROM), battery backup RAM, hard disk drive, or other similar device. Nonvolatile memory 150 is typically used to hold the executable firmware and any nonvolatile data, such as metadata 152.

In certain embodiments, coded data interface 158 comprises one or more communication interfaces that allow processor 140 to communicate with data storage media 160, 170, 180, and 190. Host information interface 132 allows processor 140 to communicate with fabric 120, switch 125 and hosts 101, 103, 105, 107, and/or 109. Examples of coded data interface 158 and host information interface 132 include serial interfaces such as RS-232, USB (Universal Serial Bus), SCSI (Small Computer Systems Interface), Fibre Channel, Gigabit Ethernet, etc. In addition, coded data interface 158 and/or host information interface 132 may comprise a wireless interface such as radio frequency, such as and without limitation, Bluetooth, or an optical communications device, such as and without limitation a device using Infrared frequencies.

In certain embodiments, metadata controller 148 is implemented in processor 140 by software, firmware, dedicated logic or combinations thereof. In addition, all or part of metadata controller 148 may reside outside controller 131, such as in a software implementation in one of hosts 101, 103, 105, 107, and/or 109. Metadata controller 148, manages metadata associated with information received for storage as coded trinary data on storage devices. In certain embodiments, metadata controller 148 is responsible for generating, changing, maintaining, storing, retrieving and processing metadata (i.e. metadata 152) associated with information received for storage as coded trinary data.

In certain embodiments, distributor 136 is implemented in processor 140 by software, firmware, dedicated logic or combinations thereof. In addition, all or part of distributor 136 may reside outside controller 131, such as in a software implementation in one of hosts 101, 103, 105, 107, and/or 109. Distributor 136 distributes coded trinary data (i.e. coded trinary data 156) to RAM, and/or directly to storage devices in a format (described below) such that the coded trinary data and/or the source information may be decoded and/or reconstructed from non-failing storage devices in the case where one or more storage devices have failed. When distributor 136 distributes the trinary data to the plurality of data storage media, such as media 160, 170, 180, and 190, the distribution is done in accordance with metadata 152, so that the distributed trinary data can be later read from the storage devices and decoded into the original binary data.

Figure 4:
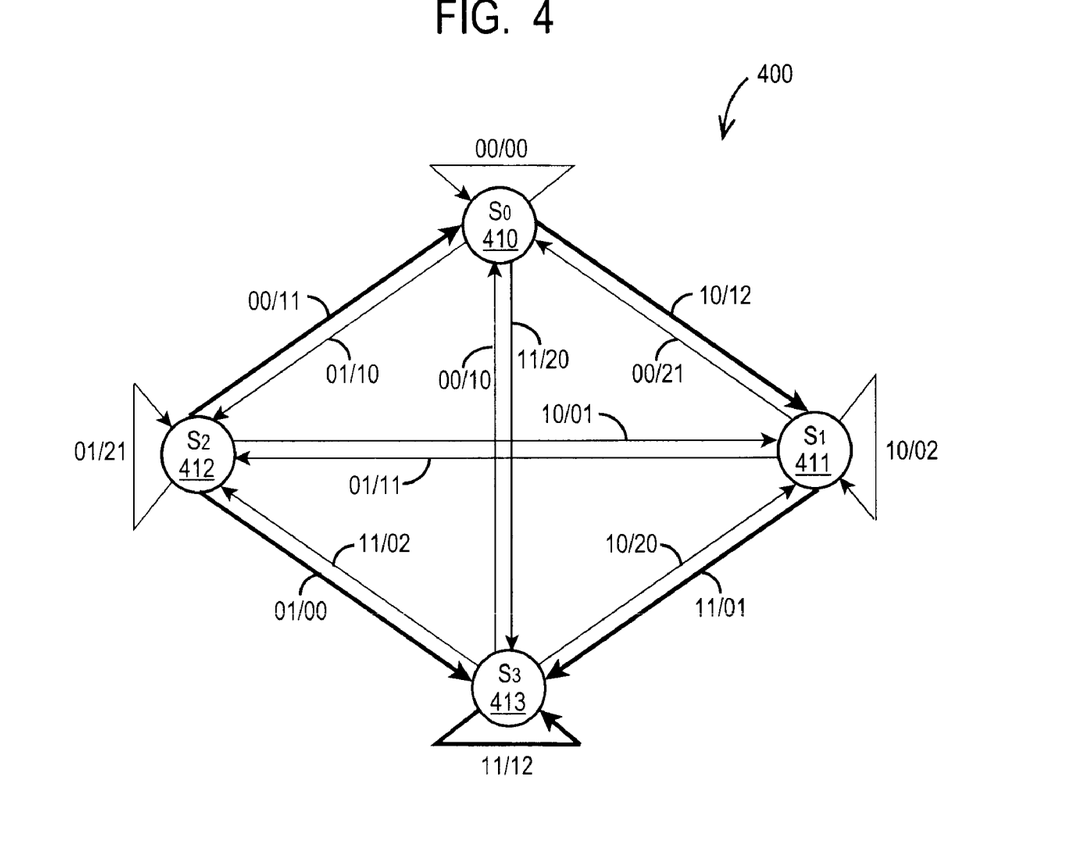
FIG. 4 comprises a state diagram which embodies Applicants' convolution encoding algorithm which is capable of encoding binary data into trinary data.

Specific circuits 142 provide additional hardware to enable controller 131 to perform unique functions, such as fan control for the environmental cooling of data storage media, 160, 170, 180, and 190, controller 131 and encoder 146. Encoder 146 may be implemented as a convolution encoder, such as and without limitation state diagram 400 (FIG. 4A). Specific circuits 142 may comprise electronics that provide Pulse Width Modulation (PWM) control, Analog to Digital Conversion (ADC), Digital to Analog Conversion (DAC), exclusive OR (XOR), etc. In addition, all or part of specific circuits 142 may reside outside controller 131, such as in a software implementation in one of hosts 101, 103, 105, 107, and/or 109.

Figure 2:
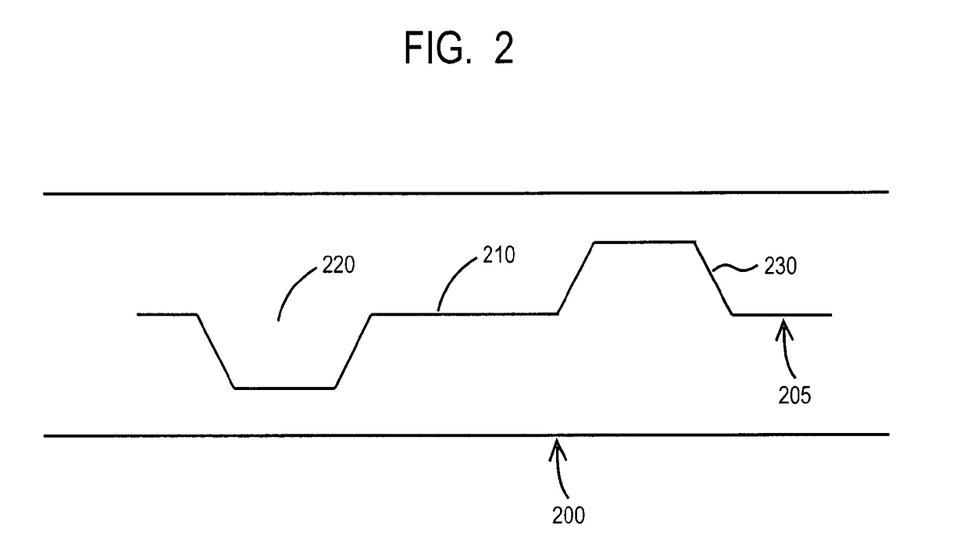
FIG. 2 is a cross-sectional view of a storage layer disposed in Applicants' information storage medium, wherein that information storage medium is capable of storing trinary data.

In certain embodiments, encoder 146 comprises a convolution encoder which encodes binary data into trinary data, wherein that trinary data is then stored in a storage layer 205 (FIG. 2) disposed in one or more of storage media 160, 170,

180, and/or 190. In certain embodiments, encoder 146 comprises a convolution encoding algorithm embodied in Table 300 (FIG. 3) and state diagram 400 (FIG. 4). In certain embodiments, decoder 144 comprises PRML trellis 500 (FIG. 5) to encode trinary data into binary data. Decoder 144 could also comprise a stack diagram. Referring now to FIG. 2, data storage layer 205 comprises a no-pit region 210, in-pit 220, and an out-pit 230. In certain embodiments, an in-pit encodes a value of 1, a no-pit encodes a value of 0, and an out-pit encodes a value of 2.

In certain embodiments, data storage layer 200 is disposed in an optical disk, such as a CD-ROM, DVD-ROM, HD-DVD-ROM, Blu-Ray-ROM, and the like. In these embodiments, data storage layer 200 is formed by stamping an optical disk blank to form an encoded optical disk.

In other embodiments, data storage layer 200 is formed using Atomic Force Microscope (AFM) probe tips disposed on both sides of layer 200. In certain embodiments, the AFMs probe tips are just a few atoms wide; so narrow, in fact, that they are used to "feel" the surface of individual atoms or push them around. Using a thin sheet of plastic, the probe tips are heated and pressed into the surface for a fraction of a second, leaving a tiny indentation just a few nanometers wide. These indentations can be very closely spaced, allowing a great deal of information to be written on a small surface area. The surface can also be "erased" by reinserting the heated probe tip, in effect melting the pit surface, which then springs back to its original shape.

In other embodiments, data storage layer 200 is magnetic and selectively magnetized at three different levels of magnetic intensity, for the storage of trinary-encoded data. These three levels of magnetic intensity are different from traditional binary, north-south polarity recording. In still other embodiments, the trinary encoded data is transmitted via three different light levels in an optical communications network. For example and referring now to FIG. 6A, first AFM probe 620 is disposed adjacent side 612 of film 600. Probe tip 630 is heated to a temperature greater than the glass transition temperature Tg of film 600. As shown in FIG. 6B, first AFM probe 620 is moved into contact with side 612 such that heated tip 630 forms a first indentation in film 600. Referring to FIG. 6C, first AFM probe 620 is then moved away from side 612 leaving an "in-pit" 640 disposed in film 602.

Figure 6A:
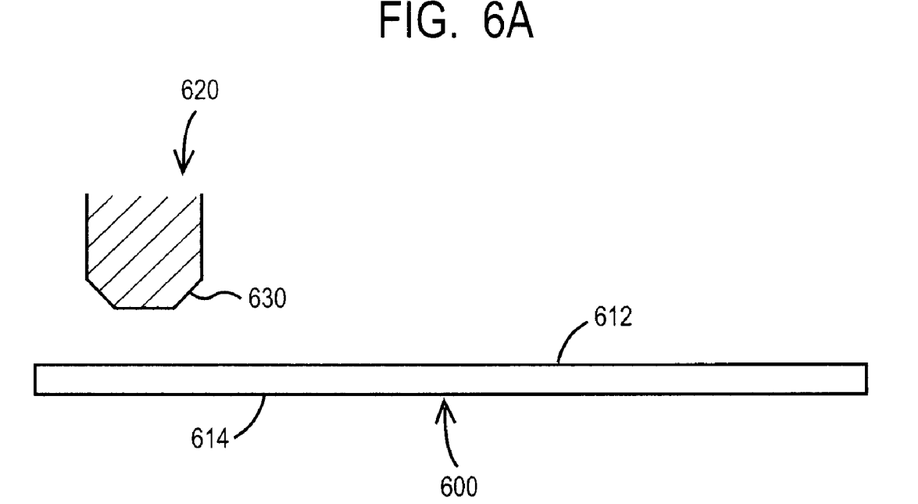
FIG. 6A shows a first step of one embodiment of Applicants' method to store trinary data into a storage layer disposed in an information storage medium.
Figure 6B:
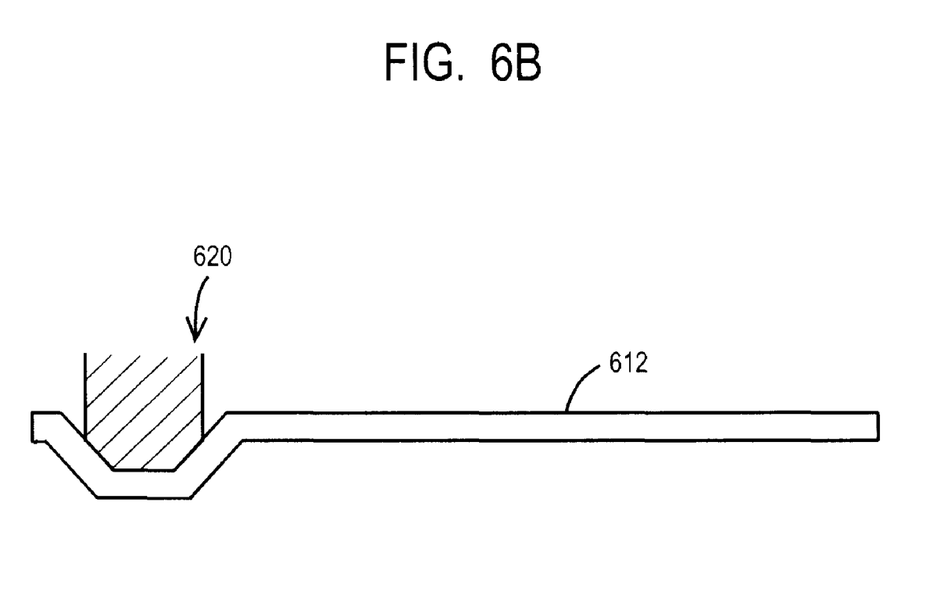
FIG. 6B shows a second step of one embodiment of Applicants' method to store trinary data into a storage layer disposed in an information storage medium.
Figure 6C:
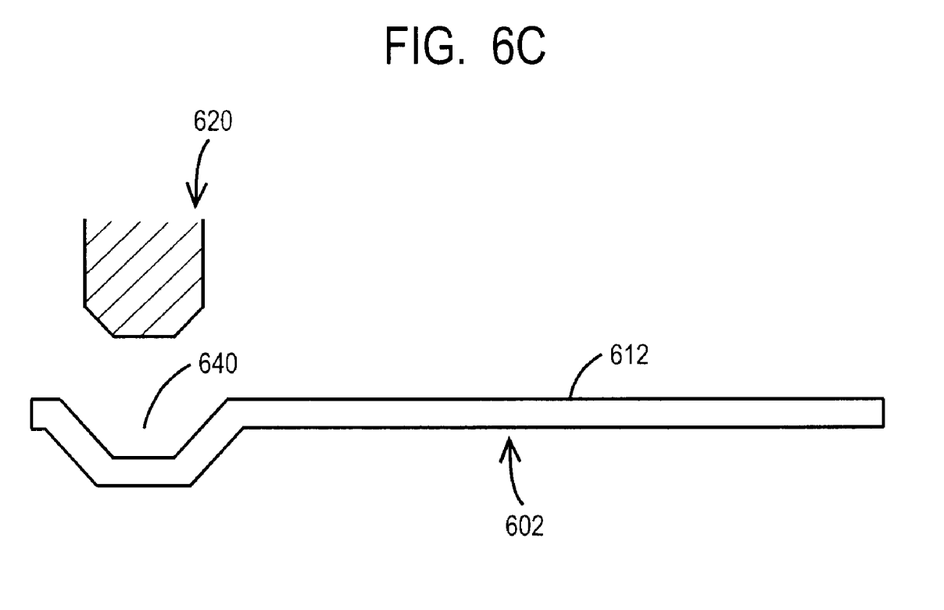
FIG. 6C shows a third step of one embodiment of Applicants' method to store trinary data into a storage layer disposed in an information storage medium.
Figure 6D:
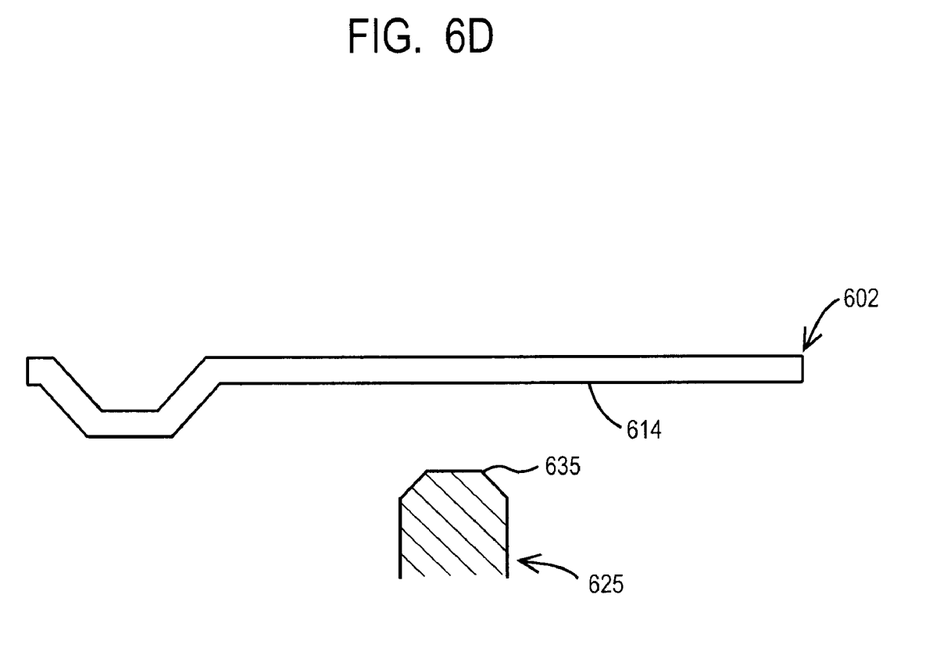
FIG. 6D shows a fourth step of one embodiment of Applicants' method to store trinary data into a storage layer disposed in an information storage medium.
Figure 6E:
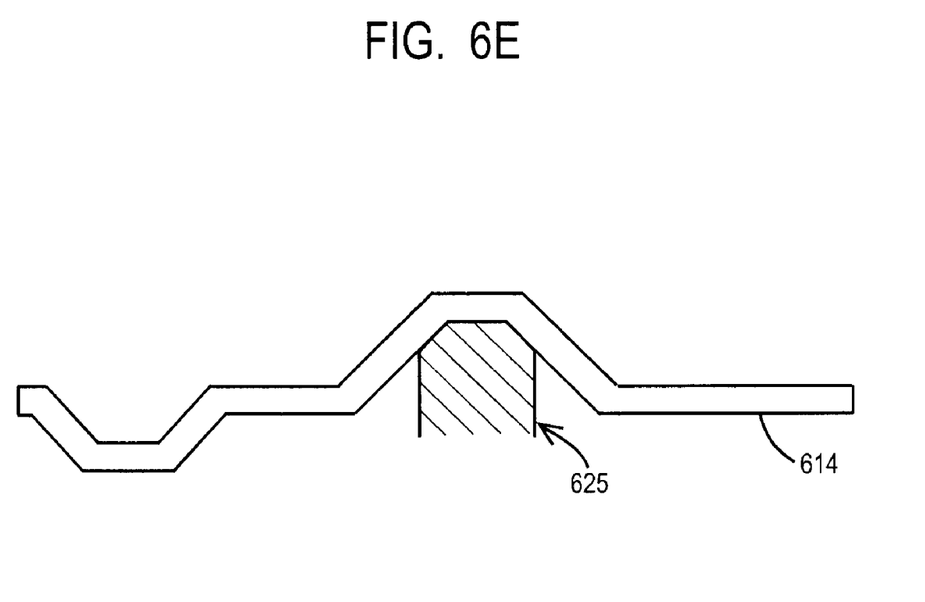
FIG. 6E shows a fifth step of one embodiment of Applicants' method to store trinary data into a storage layer disposed in an information storage medium.
Figure 6F:
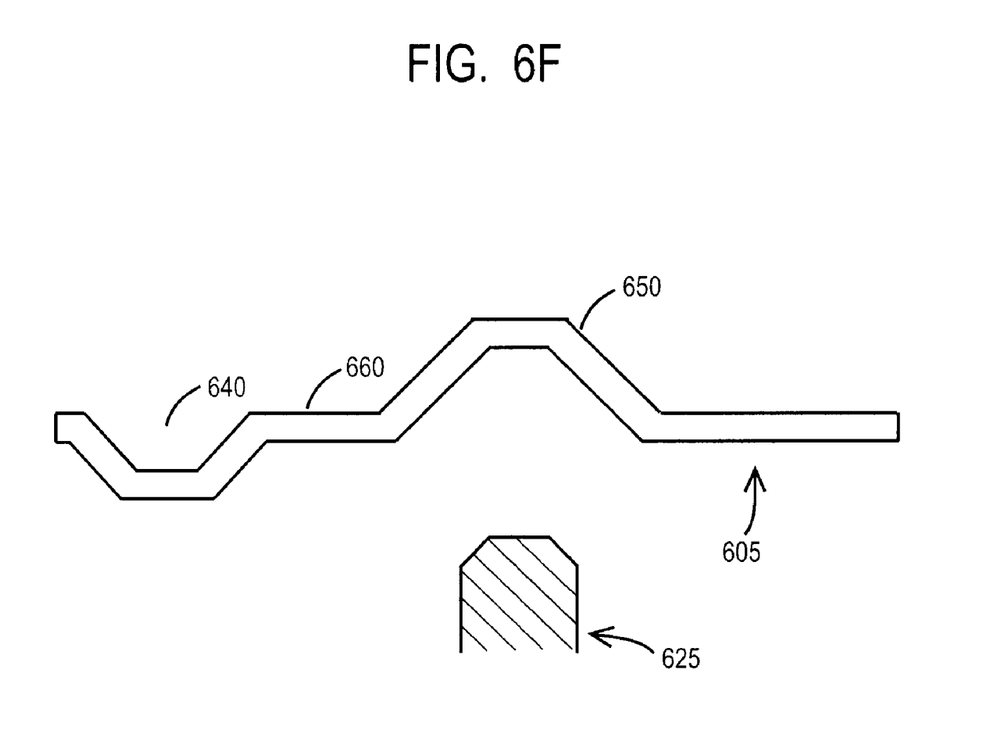
FIG. 6F shows a sixth step of one embodiment of Applicants' method to store trinary data into a storage layer disposed in an information storage medium.

FIG. 6D shows second AFM probe 625 disposed adjacent side 614 of film 602. Probe tip 635 is heated to a temperature greater than the glass transition temperature Tg of film 602. As shown in FIG. 6E, second AFM probe 620 is moved into contact with side 614 such that heated tip 635 forms a second indentation in film 602. Referring to FIG. 6F, second AFM probe 625 is then moved away from side 614 leaving an "out-pit" 650 disposed in film 605. In the illustrated embodiment of FIG. 6F, in-pit 640 is separated from out-pit 650 by no-pit region 660. As those skilled in the art will appreciate, film 605 (FIG. 5F) corresponds to storage layer 205 (FIG. 2) described hereinabove.

Figure 3:
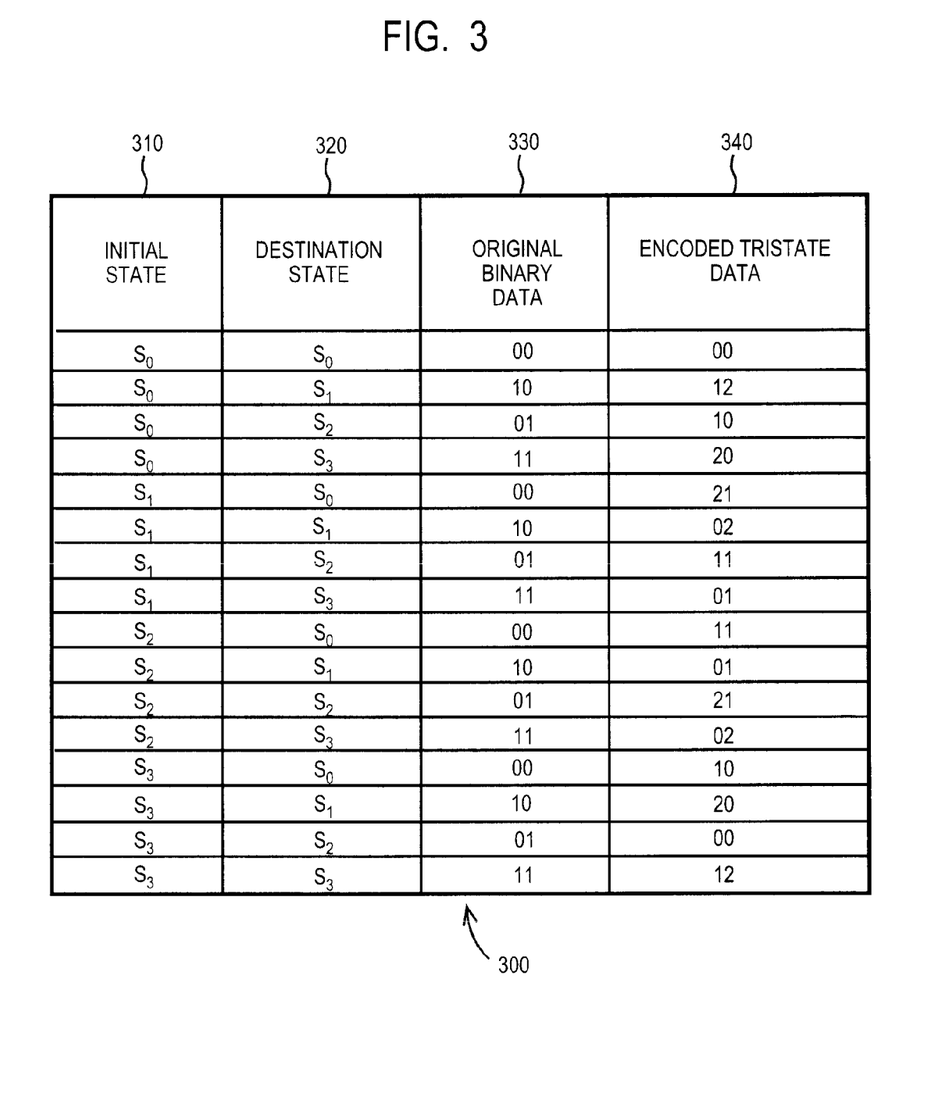
FIG. 3 is a table which embodies Applicants' convolution encoding algorithm which is capable of encoding binary data into trinary data.

Referring now to FIGS. 3 and 4, in certain embodiments Applicants' apparatus and method utilize the convolution encoding algorithm embodied in table 300 and state diagram 400, wherein that convolution encoding algorithm encodes binary data into trinary data. This description of Applicants' apparatus and method should not be taken as limiting Applicants' apparatus and method to use of only the convolution encoding algorithm embodied in table 300 and state diagram 400. Rather, in other embodiments Applicants' method utilizes differing convolution encoding algorithms.

The encoding algorithm of FIGS. 3 and 4 comprises four states: $S_0$ 410, $S_1$ 411, $S_2$ 412, and $S_3$ 413. Each transition between states results in the encoding of two bits of binary data as received from hosts 101, 103, 105, 107, 109 into two bits of trinary data as shown in FIGS. 3 and 4, which is then stored in storage 160, 170, 180, and 190.

Table 300 (FIG. 3) comprises four columns: initial state 310, destination state 320, original binary data 330, and convolution encoded trinary data 340. There are a total of sixteen rows in table 300, based on a total of four states $S_0$, $S_1$, $S_2$, and $S_3$, and four possible transitions from each initial state. Table 300 was generated via state diagram 400 and is used herein to illustrate the encoding of binary information to produce trinary data, i.e. data wherein each bit is selected from the group consisting of a "0", a "1", and a "2". The resulting trinary data can then be stored in Applicants' storage layer 200 (FIG. 2) as taught by FIGS. 6A, 6B, 6C, 6D, 6E, and 6F.

The highlighted encoding path recited in FIG. 4 illustrates the example of encoding of original information from hosts 101, 103, 105, 107 and/or 109, comprising binary bits 1011110100. In FIG. 4, the highlighted encoding path comprises: $S_0$ 410, $S_1$ 411, $S_3$ 413, $S_3$ 413, $S_2$ 412, and $S_0$ 410. Referring now to FIGS. 3 and 4: $S_0$ 410 to $S_1$ 411 encodes original binary bits 10 into trinary bits 12. $S_1$ 411 to $S_3$ 413 encodes original binary bits 11 into trinary bits 01. $S_3$ 413 to $S_3$ 413 encodes original binary bits 11 into trinary bits 12. $S_3$ 413 to $S_2$ 412 encodes original binary bits 01 into the trinary bits 00. Finally, $S_2$ 412 to $S_0$ 410 encodes original binary bits 00 into trinary bits 11.

Using the convolution encoding algorithm described hereinabove, original information comprising binary bits 1011110100 is encoded as trinary bits 1201120011 for storage in one or more of storage media 160, 170, 180, and 190, wherein those one or more storage media comprise storage layer 205 (FIG. 2) or 605 (FIG. 6F).

Figure 5:
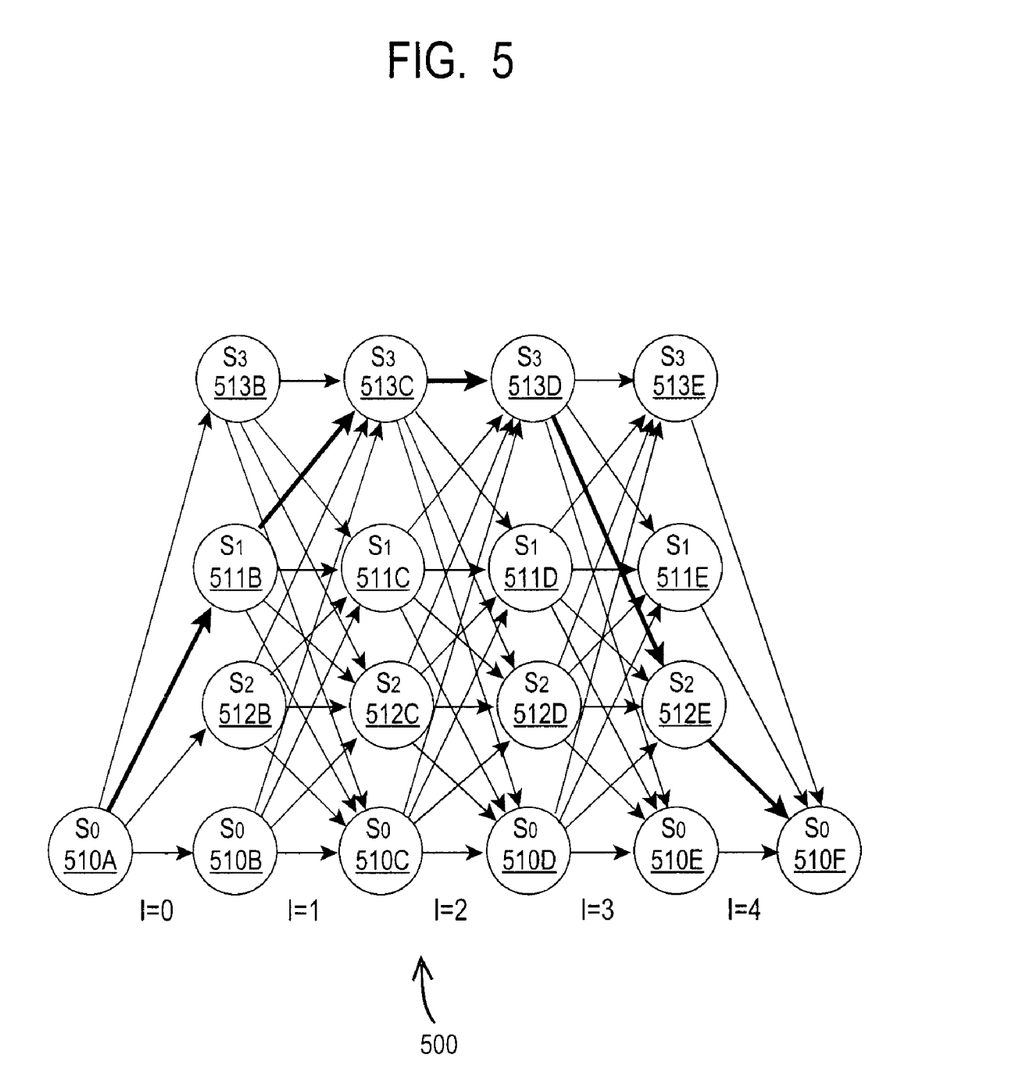
FIG. 5 illustrates a PRML trellis used to decode trinary data into binary data.

Decoding the trinary bits preferably makes use of trellis diagram 500 illustrated in FIG. 5. Such a trellis diagram is often referred to as partial response maximum likelihood ("PRML") decoding. Alternately, a "stack algorithm" could be used for this decoding, and the same result achieved.

States $S_0$-$S_3$ are shown in FIG. 5. From $S_0$ 510A, trellis diagram 500 jumps to $S_0$ 510B or $S_1$ 511B or $S_2$ 512B or $S_3$ 513B. The increase from suffix A to suffix B in the numbering of the states in trellis diagram 500 is called a branch, and the branch index I is zero when jumping from suffix A to suffix B.

In FIG. 5, the highlighted decoding path $S_0$ 510A, $S_1$ 511B, $S_3$ 513C, $S_3$ 513D, $S_2$ 512E, and $S_0$ 510F decodes trinary data 1201120011, read from storage layer 605 (FIG. 6F) by either AFM Probes 620 or 625, back into the original binary data 1011110100. $S_0$ 510A to $S_1$ 511B decodes 12 into 10. $S_1$ 511B to $S_3$ 513C decodes 01 into 11. $S_3$ 513C to $S_3$ 513D decodes 12 into 11. $S_3$ 513D to $S_2$ 512E decodes 00 into 01. Finally, $S_2$ 512E to $S_0$ 510F decodes 11 into 00, for subsequent data processing by a host, such as one or more of host computers 101, 103, 105, 107 or 109 (FIG. 1).

Applicants' invention comprises a method to encode binary data into trinary data. In certain embodiments, Applicants' method further comprises a method to store that trinary data in an information storage medium capable of storing trinary data. By "binary data," Applicants mean a plurality of bits, wherein each of those bits comprises a value selected from the group consisting of a first value and a second value. As those skilled in the art will appreciate, in certain embodiments the first value comprises a "0", and the second value comprises a "1". By "trinary data," Applicants mean a plurality of bits, wherein each of those bits comprises a value selected from the group consisting of a first value, a second value, and a third value. In certain embodiments, the first value comprises a "0", the second value comprises a "1", and the third value comprises a "2".

Figure 7:
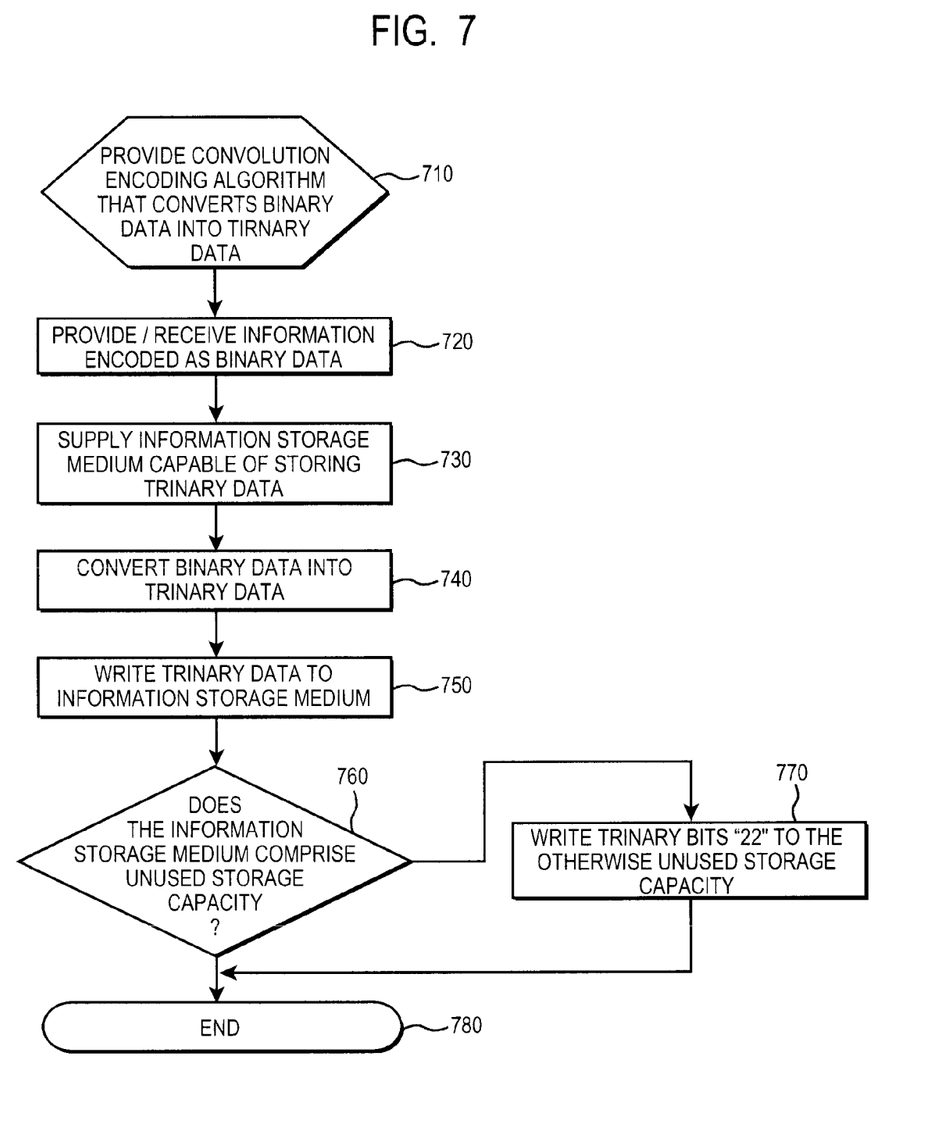
FIG. 7 is a flow chart summarizing the steps of Applicants' method to encode binary data into trinary data.

FIG. 7 summarizes the steps of Applicants' method to encode binary data into trinary, and save that trinary data in an information storage medium. Referring now to FIG. 7, in step 710 the method provides a convolution encoding algorithm that encodes binary data into trinary data. In certain embodiments, the convolution encoding algorithm of step 710 comprises Applicants' convolution encoding algorithm embodied in Table 300 (FIG. 3) and State Diagram 400 (FIG. 4).

In step 720, Applicants' method provides information encoded as binary data. In certain embodiments the binary data is provided by a host computer, such as one or more of host computers 101 (FIG. 1), 103 (FIG. 1), 105 (FIG. 1), 107 (FIG. 1), and 109 (FIG. 1). In certain embodiments, the binary data of step 720 is received by storage controller 131 (FIG. 1).

In step 730, Applicants' method supplies an information storage medium that is capable of storing trinary data. In certain embodiments, the information storage medium of step 730 comprises a storage layer capable of comprising a plurality of in-pit regions, a plurality of out-pit regions, and a plurality of no-pit regions. In other embodiments, the storage layer is magnetic and selectively magnetized at three different levels of magnetic intensity, for the storage of trinary-encoded data. These three levels of magnetic intensity are different from traditional binary, north-south polarity recording. In still other embodiments, the trinary encoded data is transmitted via three different light levels in an optical communications network.

In step 740, Applicants' method encodes the binary data of step 720 into trinary data. In certain embodiments, Applicants' method utilizes the convolution encoding algorithm embodied in Table 300 (FIG. 3) and State Diagram 400 (FIG. 4). In certain embodiments, the convolution encoding algorithm of step 740 is disposed in a storage controller, such as storage controller 131 (FIG. 1). In these embodiments, step 740 is performed by that storage controller.

In certain embodiments, the convolution encoding algorithm of step 740 is disposed in a host computer, such as one or more of host computers 101 (FIG. 1), 103 (FIG. 1), 105 (FIG. 1), 107 (FIG. 1), and 109 (FIG. 1). In these embodiments, step 740 is performed by such one or more host computers.

In step 750, Applicants' method writes the trinary data of step 740 to the information storage medium of step 730. In certain embodiments, step 750 is performed by a storage controller, such as storage controller 131 (FIG. 1). In other embodiments, step 750 is performed by a host computer, such as one or more of host computers 101 (FIG. 1), 103 (FIG. 1), 105 (FIG. 1), 107 (FIG. 1), and 109 (FIG. 1).

In certain embodiments, in step 750 a first AFM probe, such as AFM probe 620 (FIGS. 6A, 6B, 6C), is disposed adjacent a first side, such as side 612 (FIGS. 6A, 6B, 6C), of a film, such as film 600 (FIG. 6A). That first AFM probe tip is then heated to a temperature greater than the glass transition temperature Tg of the film. That heated first AFM probe is move into contact with the first side of the film such that the heated tip forms a first indentation having a first orientation in the film. Referring to FIG. 6C, first AFM probe 620 is then moved away from the film leaving an "in-pit" disposed in film 602. In certain embodiments, such an "in-pit" stores a data bit having a first value.

In these embodiments, a second AFM probe, such as AFM probe 625 (FIGS. 6D, 6E, 6F) is disposed adjacent a second and opposite side of the film, such as side 614 (FIGS. 6D, 6E, 6F). The tip of that second AFM probe is heated to a temperature greater than the glass transition temperature Tg of the film. That second AFM probe is moved into contact with the second side of the film to form a second indentation having a second orientation in the film. The second AFM probe is then moved away from the second side of the film leaving an "out-pit" in the film. In certain embodiments, such an "out-pit" stores a data bit comprising a third value.

A portion of the film that does not comprise either an "in-pit" or an "out-pit" comprises a "no-pit." In certain embodiments, such a "no-pit" stores a data bit comprising a second value.

In step 760, Applicants' method determines if the information storage medium comprises unused storage capacity after the trinary data is encoded therein in step 750. In certain embodiments, step 760 is performed by a storage controller, such as storage controller 131 (FIG. 1). In other embodiments, step 760 is performed by a host computer, such as one or more of host computers 101 (FIG. 1), 103 (FIG. 1), 105 (FIG. 1), 107 (FIG. 1), and 109 (FIG. 1).

If Applicants' method determines in step 760 that the information storage medium does not comprises unused storage capacity after the trinary data is encoded therein in step 750, then the method transitions from step 760 to step 780 and ends. If Applicants' method determines in step 760 that the information storage medium comprises unused storage capacity after the trinary data is encoded therein in step 750, then the method transitions from step 760 to step 770 wherein the method writes the set of trinary bits "22" to the otherwise unused storage capacity of the information storage medium. Using decoding trellis 500 (FIG. 5), the set of trinary bits "22" cannot be decoded into any corresponding set of binary bits, and thus can be recognized as "pad bits". This being the case Applicants apparatus and method recognize a set of trinary bits "22" to mean that the information storage medium comprises no additional encoded data, i.e. pad-bits. Applicants' method transitions from step 770 to step 780 and ends.

Trinary bits "22" may also be used to differentiate commands in an optical communications network, where three different levels of light are used to transmit trinary encoded data.

Figure 8:
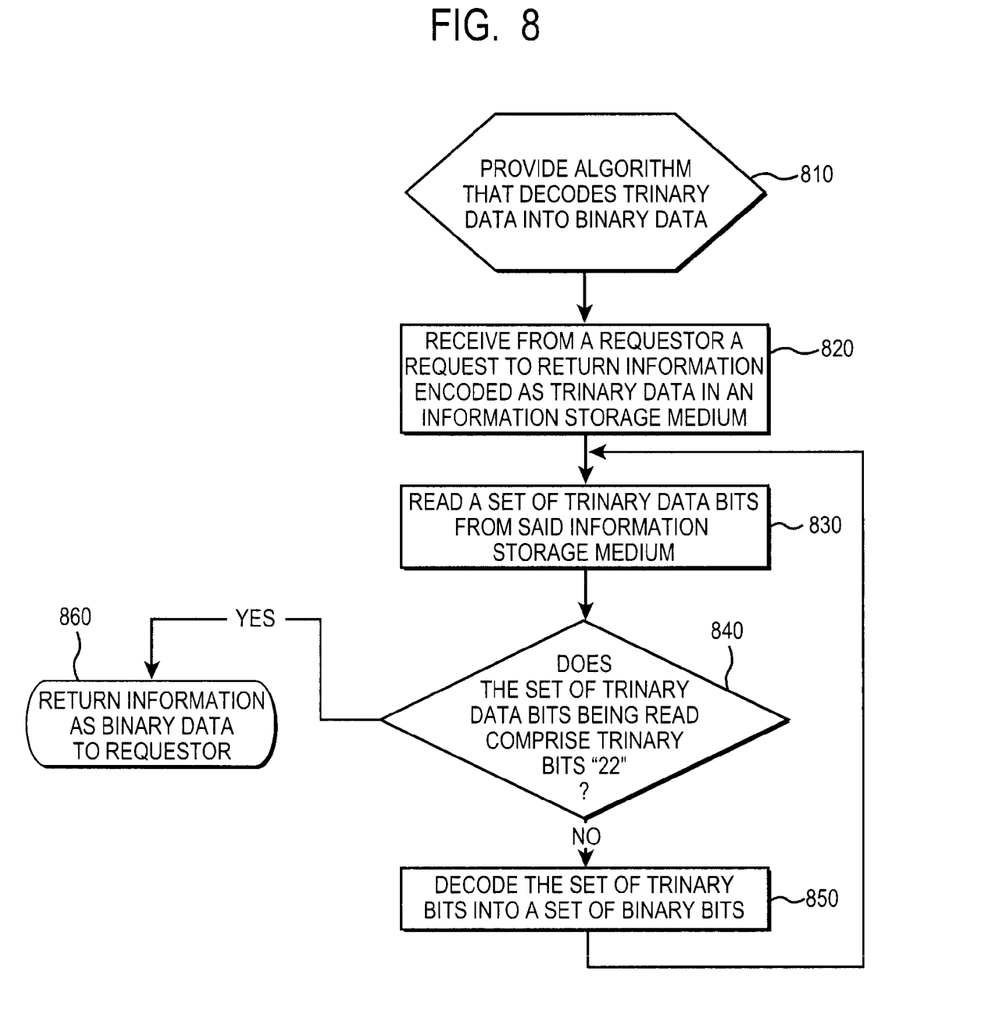
FIG. 8 is a flow chart summarizing the steps of Applicants' method to decode trinary data into binary data.

Applicants' invention further comprises a method to read trinary data from an information storage medium, and decode that trinary data into binary data. Referring now to FIG. 8, in step 810 the method provides an algorithm that decodes trinary data into binary data. In certain embodiments, the algorithm of step 810 comprises a PRML trellis, such as PRML trellis 500 (FIG. 5). In other embodiments, the algorithm of step 810 comprises a stack algorithm.

In step 820, the method receives from a requestor a request to return information encoded as trinary data. In certain embodiments, the identifier and/or location of the information storage medium comprising the requested information is included in the request of step 820. In other embodiments, the receiving storage controller determines the identify of, and the location of, the information storage medium comprising the requested information.

In certain embodiments, the requestor of step 820 comprises a host computer, such as one or more of host computers 101 (FIG. 1), 103 (FIG. 1), 105 (FIG. 1), 107 (FIG. 1), and 109 (FIG. 1). In certain embodiments, the request of step 820 is received by a storage controller, such as storage controller 131, wherein that storage controller is in communication with the requestor of step 810.

In step 830, the method reads a set of trinary data bits from the information storage medium comprising the requested information. In step 840, the method determines if the set of trinary data bits read in step 820 comprises the trinary bits "22". In certain embodiments, step 830 is performed by a storage controller, such as storage controller 131 (FIG. 1). In other embodiments, step 830 is performed by a host computer, such as one or more of host computers 101 (FIG. 1), 103 (FIG. 1), 105 (FIG. 1), 107 (FIG. 1), and 109 (FIG. 1).

If the method determines in step 840 that the trinary data bits read in step 830 comprise the trinary data bits "22", then the method transitions from step 840 to step 860 wherein the method determines that the requested information has been decoded into binary data, and that the trinary "22" pad-bits are ignored in this decoding, and wherein the method returns that binary data to the requestor of step 820. In certain embodiments, step 830 is performed by a storage controller, such as storage controller 131 (FIG. 1). In other embodiments, step 830 is performed by a host computer, such as one or more of host computers 101 (FIG. 1), 103 (FIG. 1), 105 (FIG. 1), 107 (FIG. 1), and 109 (FIG. 1).

Alternatively, if the method determines in step 840 that the trinary data bits read in step 830 do not comprise the trinary data bits "22", then the method transitions from step 840 to step 850 wherein the method decodes the trinary data bits read in step 830 into a set of binary data bits. The method transitions from step 850 to step 830 and continues as described herein.

In certain embodiments, step 850 is performed by a storage controller, such as storage controller 131 (FIG. 1). In other embodiments, step 850 is performed by a host computer, such as one or more of host computers 101 (FIG. 1), 103 (FIG. 1), 105 (FIG. 1), 107 (FIG. 1), and 109 (FIG. 1).

In certain embodiments, individual steps recited in FIGS. 7 and 8 may be combined, eliminated, or reordered.

In certain embodiments, Applicants' invention includes instructions residing memory 150 (FIG. 1), wherein those instructions are executed by a processor, such as processor 140 (FIG. 1), to perform one or more of steps 720, 740, 750, 760, and/or 770, recited in FIG. 7, and/or one or more of steps 820, 830, 840, 850, and/or 860, recited in FIG. 8.

In other embodiments, Applicants' invention includes instructions residing in any other computer program product, where those instructions are executed by a computer external to, or internal to, system 100, to perform one or more of steps 720, 740, 750, 760, and/or 770, recited in FIG. 7, and/or one or more of steps 820, 830, 840, 850, and/or 860, recited in FIG. 8. In either case, the instructions may be encoded in an information storage medium comprising, for example, a magnetic information storage medium, an optical information storage medium, an electronic information storage medium, and the like. By "electronic storage media," Applicants mean, for example, a device such as a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method to encode binary data into trinary data, comprising:
    receiving a pair of binary bits, wherein each binary bit is selected from the group consisting of 0 and 1;
    encoding said pair of binary bits into a pair of trinary bits wherein each trinary bit is selected from the group consisting of 0, 1, and 2;
    wherein said pair of binary bits are not encoded into a pair of trinary bits consisting of 22.

2. The method of claim 1, further comprising the steps of:
    supplying an information storage medium capable of encoding trinary data;
    encoding said trinary data in said information storage medium.

3. The method of claim 2, further comprising the step of supplying a storage controller comprising a convolution encoding algorithm;
    wherein said providing step comprises providing said binary data to said storage controller; and
    wherein said encoding step is performed by said storage controller.

4. The method of claim 2, wherein said trinary data comprises a plurality of bits, wherein each of those plurality of bits comprises a value selected from the group consisting of a first value, a second value, and a third value.

5. The method of claim 4, wherein said information storage medium comprises a storage layer, wherein said encoding step comprises the steps of:
    encoding a bit comprising said first value as an in-pit in said storage layer;
    encoding a bit comprising said second value as a no-pit in said storage layer; and
    encoding a bit comprising said third value as an out-pit in said storage layer.

6. The method of claim 5, further comprising the steps of supplying a film, wherein said film comprises said storage layer;
    supplying a first indenter disposed adjacent a first side of said film, wherein said first indenter comprises a tip portion;
    wherein said encoding a bit comprising said first value as an in-pit step further comprises the steps of:
    heating said tip portion of said first indenter;
    moving said heated tip portion of said first indenter into contact with said first side of said film to form a first indentation.

7. The method of claim 6, further comprising the steps of:
    supplying a second indenter disposed adjacent a second side of said film, wherein said second indenter comprises a tip portion;
    wherein said encoding a bit comprising said third value as an out-pit further comprises the steps of:
    heating said tip portion of said second indenter;
    moving said heated tip portion of said second indenter into contact with said second side of said film to form a second indentation.

8. The method of claim 4, wherein said information storage medium comprises a magnetic storage medium, wherein said encoding step comprises the steps of:
    encoding a bit comprising said first value as a first level of magnetic intensity;
    encoding a bit comprising said second value as a second level of magnetic intensity; and
    encoding a bit comprising said third value as a third level of magnetic intensity.

9. The method of claim 4, wherein said information storage medium comprises an optical communications network, wherein said encoding step comprises the steps of:
    encoding a bit comprising said first value as a first level of light intensity;
    encoding a bit comprising said second value as a second level of light intensity; and
    encoding a bit comprising said third value as a third level of light intensity.

10. The method of claim 2, further comprising the steps of:
    receiving a request from a requestor to return said binary data;

reading a set of trinary data bits from said information storage medium;

determining if said set of trinary data bits comprises the trinary bits "22";

operative if said set of trinary data bits does not comprises the trinary bits "22":

decoding said set of trinary data bits into a set of binary data bits; and repeating for a different set of trinary data bits said reading step, said determining step, and optionally said decoding step.

11. An article of manufacture comprising a computer readable medium having computer readable program code disposed therein to store information, the computer readable program code comprising a series of computer readable program steps to effect:

receiving a pair of binary bits, wherein each binary bit is selected from the group consisting of 0 and 1;

encoding said pair of binary bits into a pair of trinary bits wherein each trinary bit is selected from the group consisting of 0, 1, and 2;

wherein said pair of binary bits are not encoded into a pair of trinary bits consisting of 22.

12. The article of manufacture of claim 11, wherein said article of manufacture is in communication with an information storage medium capable of encoding trinary data, said computer readable program code further comprising a series of computer readable program steps to effect encoding said trinary data in said information storage medium.

13. The article of manufacture of claim 12, wherein said computer readable program code to encode said binary data into trinary data further comprises a convolution encoding algorithm.

14. The article of manufacture of claim 12, wherein said trinary data comprises a plurality of bits, wherein each of those plurality of bits comprises a value selected from the group consisting of a first value, a second value, and a third value.

15. The article of manufacture of claim 14, wherein said information storage medium comprises a storage layer, wherein said computer readable program code to encode said trinary data further comprises a series of computer readable program steps to effect:

encoding a bit comprising said first value as an in-pit in said storage layer;

encoding a bit comprising said second value as a no-pit in said storage layer; and encoding a bit comprising said third value as an out-pit in said storage layer.

16. The article of manufacture of claim 15, wherein said article of manufacture is in communication with a first indenter disposed adjacent a first side of a film comprising said storage layer, wherein said first indenter comprises a tip portion, wherein said computer readable program code to encode a bit comprising said first value as an in-pit step further comprises a series of computer readable program steps to effect:

heating said tip portion of said first indenter;

moving said heated tip portion of said first indenter into contact with said first side of said film to form a first indentation.

17. The article of manufacture of claim 16, wherein said article of manufacture is in further communication with a second indenter disposed adjacent a second side of said film, wherein said second indenter comprises a tip portion, wherein said computer readable program code to encode a bit comprising said third value as an out-pit step further comprises a series of computer readable program steps to effect:

heating said tip portion of said second indenter;

moving said heated tip portion of said second indenter into contact with said second side of said film to form a second indentation.

18. The article of manufacture of claim 14, wherein said information storage medium comprises a magnetic storage medium, wherein said encoding step comprises the steps of:

encoding a bit comprising said first value as a first level of magnetic intensity;

encoding a bit comprising said second value as a second level of magnetic intensity; and encoding a bit comprising said third value as a third level of magnetic intensity.

19. The article of manufacture of claim 14, wherein said information storage medium comprises an optical communications network, wherein said encoding step comprises the steps of:

encoding a bit comprising said first value as a first level of light intensity;

encoding a bit comprising said second value as a second level of light intensity; and encoding a bit comprising said third value as a third level of light intensity.

20. The article of manufacture of claim 12, further comprising the steps of:

receiving a request from a requestor to return said binary data;

reading a set of trinary data bits from said information storage medium;

determining if said set of trinary data bits comprises the trinary bits "22";

operative if said set of trinary data bits does not comprises the trinary bits "22":

decoding said set of trinary data bits into a set of binary data bits; and repeating for a different set of trinary data bits said reading step, said determining step, and optionally said decoding step.

* * * * *